United States Patent
Park et al.

(10) Patent No.: US 7,087,461 B2
(45) Date of Patent: Aug. 8, 2006

(54) PROCESS AND LEAD FRAME FOR MAKING LEADLESS SEMICONDUCTOR PACKAGES

(75) Inventors: HyungJun Park, Paju-Si (KR); HyeongNo Kim, Paju-Si (KR); SangBae Park, Paju-Si (KR); YongGil Lee, Paju-Si (KR); KyungSoo Rho, Paju-Si (KR); JunYoung Yang, Paju-Si (KR); JinHee Won, Paju-Si (KR)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/915,326

(22) Filed: Aug. 11, 2004

(65) Prior Publication Data

US 2006/0033184 A1  Feb. 16, 2006

(51) Int. Cl.
*H01L 21/44* (2006.01)
*H01L 21/48* (2006.01)
*H01L 21/50* (2006.01)

(52) U.S. Cl. ............ 438/112; 438/123; 438/124; 438/127; 257/E23.061

(58) Field of Classification Search .......... 438/112, 438/123, 124, 127; 257/E23.061
See application file for complete search history.

(56) References Cited

U.S. PATENT DOCUMENTS

| | | | |
|---|---|---|---|
| 6,261,864 B1 | 7/2001 | Jung et al. | 438/106 |
| 6,333,252 B1 | 12/2001 | Jung et al. | 438/612 |
| 6,342,730 B1 | 1/2002 | Jung et al. | 257/692 |
| 6,489,218 B1 | 12/2002 | Kim et al. | 438/460 |
| 6,495,909 B1 | 12/2002 | Jung et al. | 257/684 |
| 6,528,893 B1 | 3/2003 | Jung et al. | 257/787 |
| 6,773,961 B1 | 8/2004 | Lee et al. | 438/112 |
| 6,872,599 B1 * | 3/2005 | Li et al. | 438/123 |
| 2003/0207498 A1 * | 11/2003 | Islam et al. | 438/120 |

* cited by examiner

*Primary Examiner*—Nitin Parekh
(74) *Attorney, Agent, or Firm*—Michael Bednarek; Pillsbury Winthrop Shaw Pittman LLP

(57) ABSTRACT

A process for making a plurality of leadless packages is disclosed. Firstly, chips are attached onto a lead frame with a first metal layer formed thereon. Each lead of the lead frame has a first portion, a second portion and a third portion connecting the first portion and the second portion, wherein the first metal layer is not provided on the third portion. After a wire bonding step and an encapsulating step are conducted, a second metal layer is selectively plated on the first portions and the second portions of the leads and the die pads exposed from the bottom of the molded product. Then, the third portion of each lead is selectively etched away such that the first portion and the second portion are electrically isolated from each other. Finally, a singulation step is conducted to complete the process. The present invention further provides a new lead frame design.

20 Claims, 6 Drawing Sheets

PROCESS AND LEAD FRAME FOR MAKING LEADLESS SEMICONDUCTOR PACKAGES

BACKGROUND OF THE INVENTION

1. Field of the Invention

This invention relates to a process and a lead frame for making leadless semiconductor packages.

2. Description of the Related Art

Lead frame packages have been used for a long period of time in the IC packaging history mainly because of their low manufacturing cost and high reliability. However, as integrated circuits products move its endless pace toward both a faster speed and a smaller size, the traditional lead frame packages have become gradually obsolete for some high performance-required packages. Thus BGA (Ball Grid Array Packages) and CSP (Chip Scale Package) have emerged and become increasingly popular as a new packaging choice.

However, the lead frame package still remains its market share as a cost-effective solution for low I/O ICs. Traditional lead frame package has its limit of providing a solution for chip scale and low profile package due to the long inner leads and outer leads. Therefore, the semiconductor packaging industry develops a leadless package without outer leads such that both the footprint and the package profile can be greatly reduced. Due to the elimination of the outer leads, leadless packages are featured by lower profile and light weight. Furthermore, due to the lead length reduction, the corresponding reduction in the resistance, conductance and capacitance make the leadless package very suitable for RF (radio-frequency) product packages operating in several GHz to tens of GHz frequency range. It's also a cost-effective package due to its use of existing BOM (bill of materials). All the above-mentioned properties make the current leadless packages very suitable for telecommunication products such as cellular phones, portable products such as PDA (personal digital assistant), digital cameras, and IA (Information Appliance).

FIGS. 1–2 show a conventional leadless package 10 including a chip 12 disposed on a die pad 11b sealed in a package body 13. The chip 12 is provided with a plurality of bonding pads electrically connected to leads 11a. The leads 11a are exposed from the lower surface of the package body 13 for making external electrical connection.

However, the conventional leadless package 10 has various design and production limitations. For example, in order to reduce the size of the package while not increasing the number of I/O connections or to increase the number of I/O connections while not increasing the package size, the density of the leads 11a should be increased since the leads 11a are only arranged about the lateral periphery of the package 10. This is especially apparent when the chip 12 has high density and high frequency digital circuitry. Such an increase in the density of leads inherently requires a reduced pitch or spacing between adjacent leads thereby increasing likelihood of cross-talk and signal interference and making such packages more difficult to fabricate.

SUMMARY OF THE INVENTION

It is therefore an object of the present invention to provide a process for making a plurality of staggered multi-row leadless packages that satisfy the need for a significantly higher number of connection pads in a smaller footprint.

It is another object of the present invention to provide a lead frame designed to make the aforementioned staggered multi-row leadless packages.

According to one aspect of the invention, a process having features of the present invention includes the following steps. Firstly, a plurality of chips are attached onto the die pads of a lead frame with a first metal layer formed on the upper surface thereof. The lead frame suitable for use in the process includes a plurality of units in an array arrangement and a plurality of dambars between the units. Each unit of the lead frame includes a die pad for receiving a semiconductor chip and a plurality of tie bars for connecting the die pad to the dambars. Each unit of the lead frame includes a die pad and a plurality of leads each having a first portion, a second portion and a third portion connecting the first portion and the second portion, wherein the first metal layer is not provided on the third portion.

Thereafter, each lead of the lead frame is electrically coupled to two different bonding pads of one of the chips such that the first portion of each lead is electrically connected to one bonding pad and the second portion of each lead is electrically connected to the other bonding pad. After a tape is attached onto the lower surface of the lead frame, the chips are encapsulated against the upper surface of the lead frame to form a molded product. After the tape is removed from the bottom of the molded product, a second metal layer is selectively plated on the first portions and the second portions of the leads and the die pads exposed from the bottom of the molded product wherein the second metal layer is not provided on the second portions of the leads. Then, the third portion of each lead of the lead frame is selectively etched away such that the first portion and the second portion are electrically isolated from each other and become two connection pads. Finally, a singulation step is conducted to obtain the leadless semiconductor packages. Note that each lead of the lead frame is selectively etched away the third portion thereof thereby forming two rows of connection pads. In this way, the number of I/O connections is significantly increased while the pitch or spacing between adjacent leads is not required to be reduced. Accordingly, the finished leadless semiconductor packages satisfy the need for a significantly higher number of connection pads in a smaller footprint.

According to another aspect of the invention, there is provided a lead frame designed to make the staggered multi-row leadless packages. The lead frame includes outer and inner leads arranged about the periphery of the die pad in each unit. Each of the outer leads is connected to one of the dambars. Each of the inner leads is disposed between the outer leads and the die pad, and the inner leads are connected to each other and the tie bars.

The present invention further provides a process for making a plurality of staggered multi-row leadless packages using the lead frame just described above. This process is substantially identical to the aforementioned process with an exception that an etching step is conducted to selectively remove the connecting portions between the inner leads of the lead frame such that the inner leads are electrically isolated from each other.

According to another aspect of the invention, there is provided another lead frame designed to make the staggered multi-row leadless packages. This lead frame includes first and second leads arranged about the periphery of the die pad in each unit. Each of the first leads has one end connected to the dambars. Each of the second leads has an enlarged portion adapted for electrically coupling to the semiconductor chip and a narrowed portion connected to the dambars. Such kind of lead frame design is fully compatible with the existing materials and does not affect their properties; it is cheap and of extremely easy implementation. In addition, the packaging method using the aforementioned lead frame is fully compatible with the current processes and related equipment used in the industry.

BRIEF DESCRIPTION OF THE DRAWINGS

These and other features, aspects, and advantages of the present invention will be more fully understood by reading the following detailed description of the preferred embodiment, with reference made to the accompanying drawings as follows.

DETAILED DESCRIPTION OF THE PREFERRED EMBODIMENT

Figure 1:
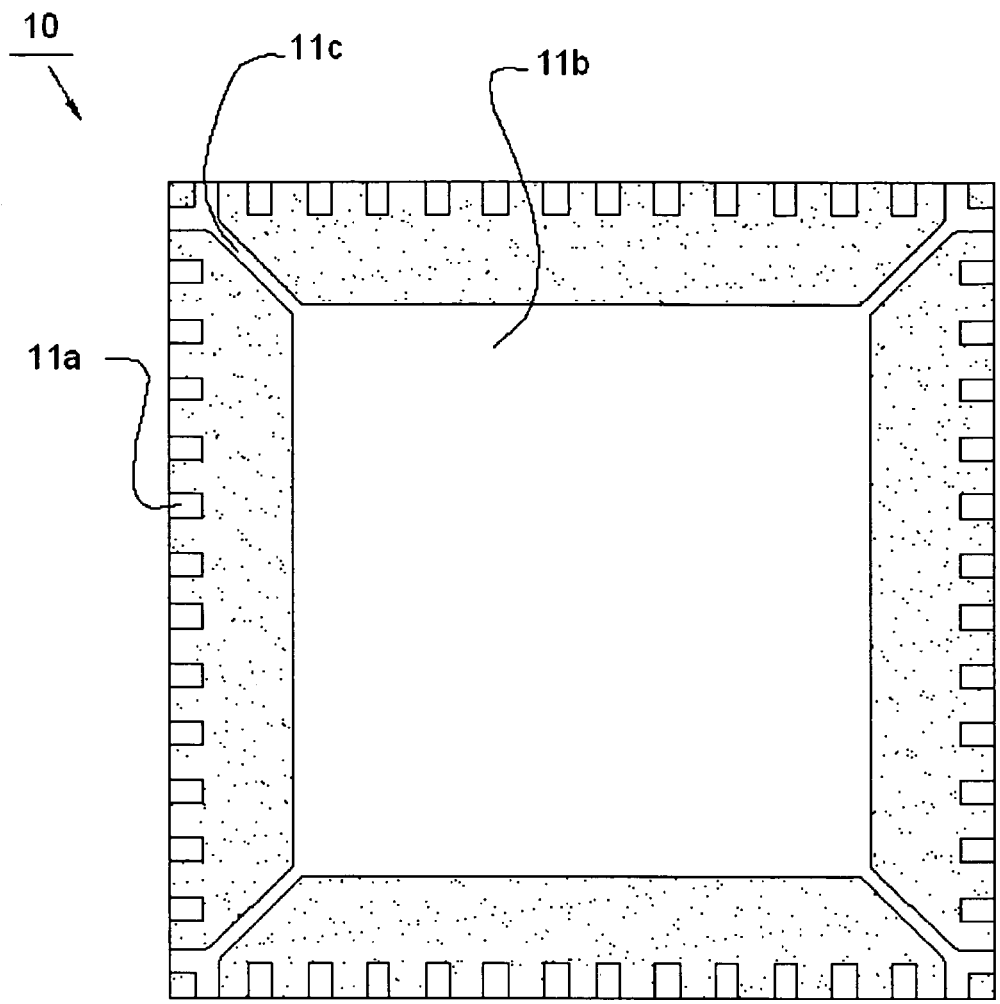
FIG. 1 is a bottom view of a conventional leadless package.
Figure 2:
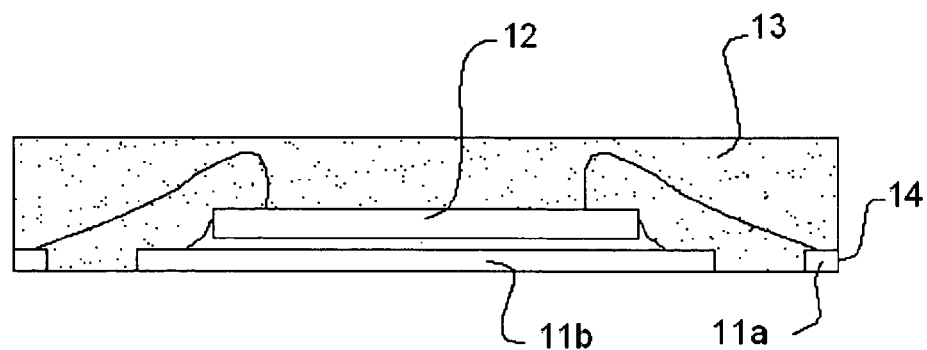
FIG. 2 is a cross sectional view of the leadless package of FIG. 1.
Figure 3A:
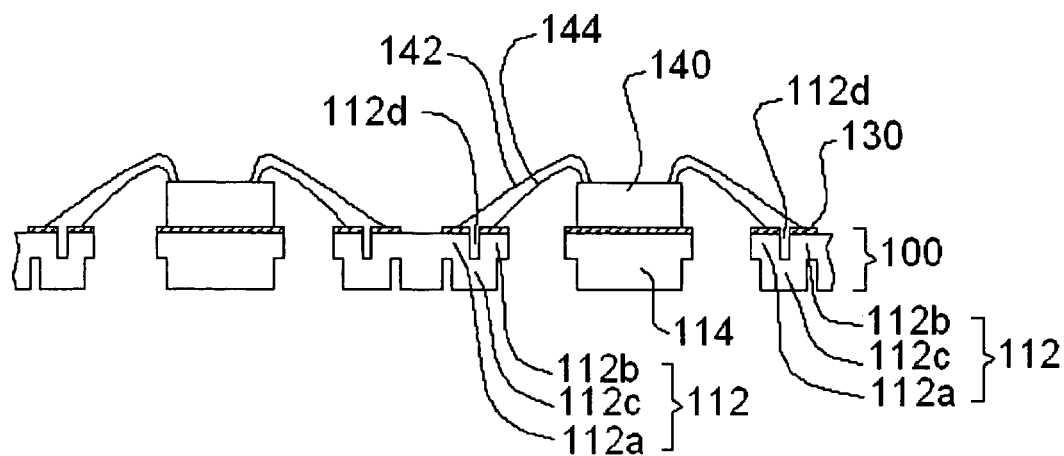
FIGS. 3a to 3g illustrate in cross-section major steps of a process for making a plurality of staggered dual-row leadless packages according to one embodiment of the present invention.
Figure 3B:
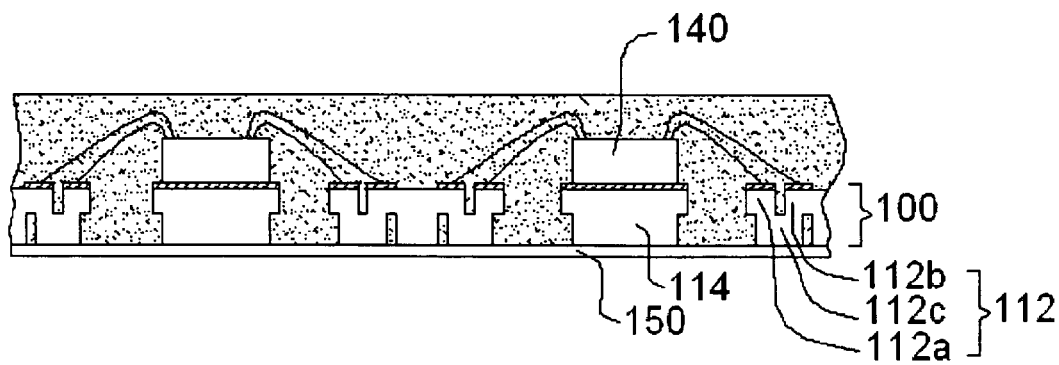
Figure 3C:
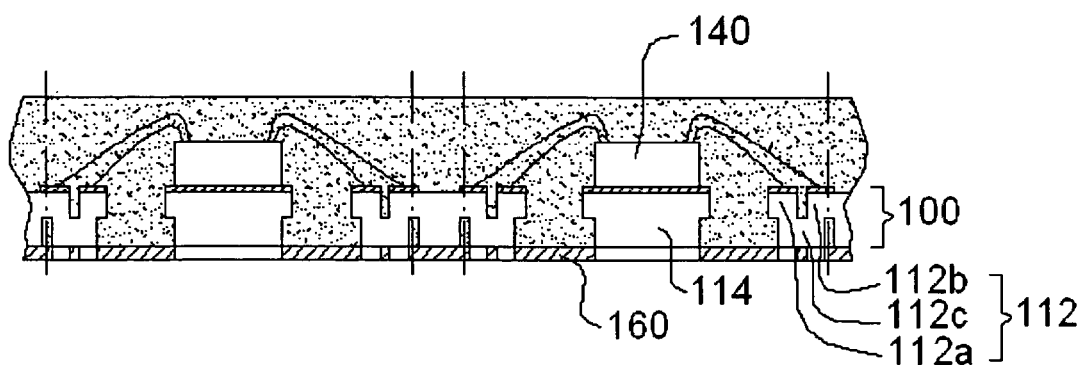
Figure 3D:
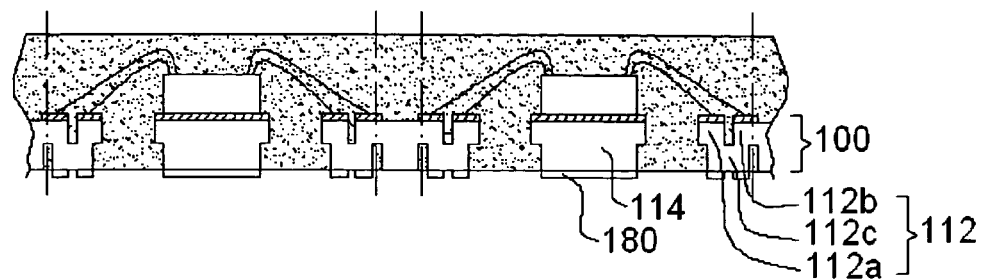
Figure 3E:
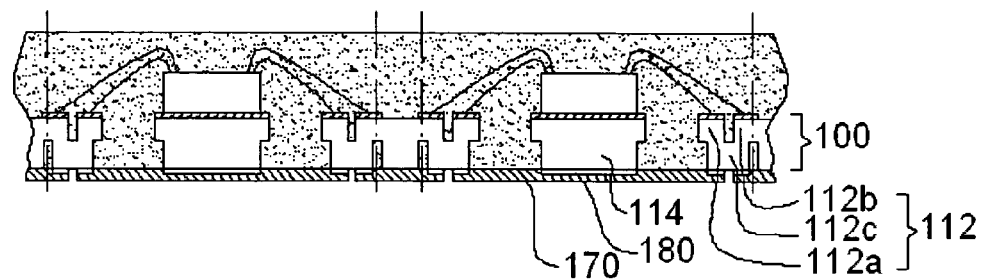
Figure 3F:
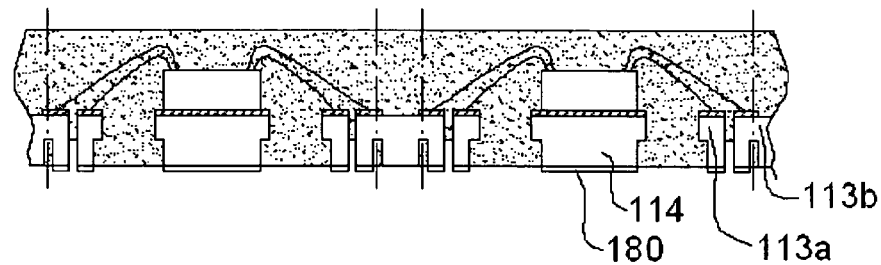
Figure 3G:
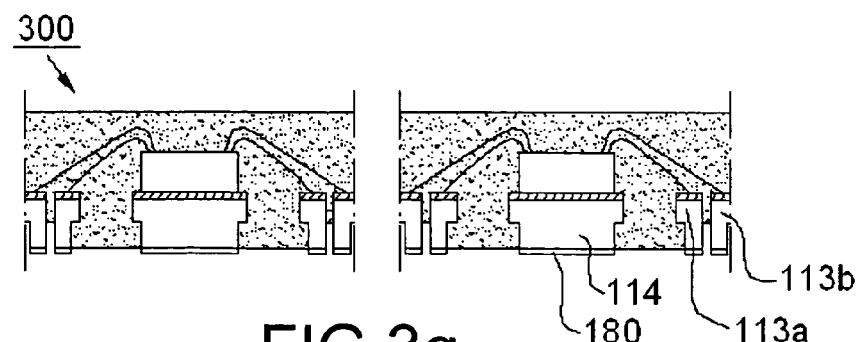
Figure 4:
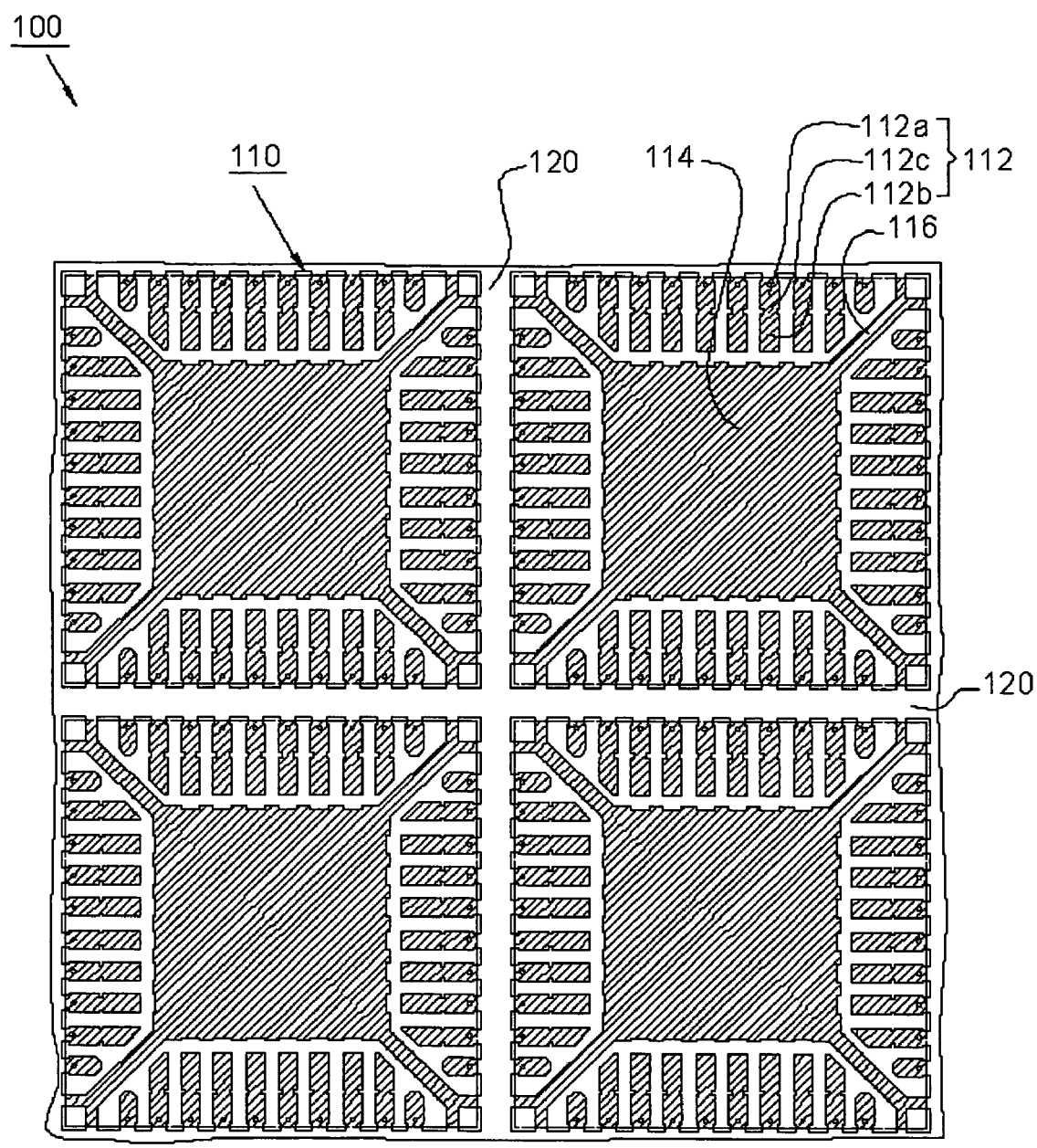
FIG. 4 is a top plan view of a lead frame suitable for use in the process illustrated in FIGS. 3a to 3k.

FIGS. 3a to 3g illustrate in cross-section major steps of a process for making a plurality of staggered dual-row leadless packages using the lead frame 100 shown in FIG. 4 according to one embodiment of the present invention.

As shown in FIG. 4, the lead frame 100 includes a plurality of units 110 in an array arrangement. The units 110 of the lead frame 100 are separated from each other by a plurality of dambars 120 which generally form an orthogonal grid on the lead frame 100. Though only four units 110 are shown in FIG. 4, a lead frame for use with the invention can include any number of units if desired. Each of the units 110 of the lead frame includes a plurality of leads 112 (only one lead is denoted with the numeral 112 in FIG. 4 for simplicity) arranged at the periphery of a die pad 114. Each die pad 11b is connected to the dambars 120 by four tie bars 116 (only one tie bar is denoted with the numeral 116 in FIG. 4 for simplicity). Each of the leads 112 has a first portion 112a, a second portion 112b and a third portion 112c connecting the first portion 112a and the second portion 112b. Note that the leads 112, the die pads 114 and the tie bars 116 are hatched in FIG. 4 to facilitate understanding. The lead frame for use with the present invention is typically made of a copper-base alloy or made of copper or alloys containing copper, and shaped by pressing or etching. As shown in FIG. 3a, the upper surface of lead frame 100 is plated with a first metal layer 130 which covers the first portions 112a and the second portions 112b of the leads 112 and the die pads 114 but does not cover the third portions 112c of the leads 112. Preferably, the first metal layer 130 is formed of materials that allow a good bond to the conventional bonding wire material, e.g., silver, gold or palladium.

Alternatively, each of the leads 112 of the lead frame 100 may be half-etched at its upper surface to form an indentation 112d (see FIG. 3a) at the third portion 112c thereof. Specifically, "half-etching" may comprise the steps of: (a) forming a photoresist layer on the upper surface of the lead frame by conventional techniques such as dry film lamination; (b) photodefining the photoresist layer through a photomask and developing such that areas on the surface of the lead frame at which they are desired to form the indentations 112d are not covered by the photoresist; (c) etching areas on the upper surface of the lead frame exposed from the remaining photoresist layer to form the indentations 112d; and (d) stripping the remaining photoresist by using conventional techniques. It is noted that the "half-etching" herein does not mean only exactly removing half of the thickness of the lead frame through etching but also includes a partial etching for removing merely a part of the thickness of the lead frame.

Referring to FIG. 3a, semiconductor chips 140 are respectively attached to the die pads 114 by means of silver epoxy (not shown), and the epoxy is cured after die attach. After that, a plurality of bonding wires 142 and 144 are connected to the chip 140 and the leads 112 using known wire bonding techniques. Note that the first portion 112a and the second portion 112b of each lead 112 are electrically coupled to two different bonding pads of one semiconductor chip 140 via the bonding wire 142 and the bonding wire 144, respectively.

Referring to FIG. 3b, a polyimide (PI) tape 150 is attached onto the lower surface of the lead frame 100, and this is to prevent the mold flash problem in the molding process. Then, the chips 140 are encapsulated against the upper surface of the lead frame 100 to form a molded product. Usually, a MAP (mold array package) molding process is used to accomplish this encapsulation.

After the tape 150 is removed, a second metal layer 180 (see FIG. 3d), e.g., a layer of tin/lead, is selectively plated on the first portions 112a and the seconds portion 112b of each lead 112 and the die pads 114 by using a photoresist pattern 160 (see FIG. 3c) as mask. As shown in FIG. 3c, the photoresist pattern 160 used herein is formed on the bottom of the molded product such that the photoresist pattern 160 covers the third portions 112c of the leads 112 but does not cover the first portions 112a and the second portions 112b of the leads 112 and the die pads 114.

Referring to FIGS. 3e and 3f, the third portion 112c of each lead 112 of the lead frame 100 is selectively etched away by using a photoresist pattern 170 as an etch mask such that the first portion 112a and the second portion 112b are electrically isolated from each other and become two connection pads 113a and 113b. As shown in FIG. 3e, the photoresist pattern 170 used herein is formed on the bottom of the molded product such that the entire lower surface of the lead frame 100 is covered with the photoresist pattern 170 except the third portion 112c of each lead 112 of the lead frame 100.

After the photoresist pattern 170 is removed, a singulation step is conducted to obtain the staggered dual-row leadless packages 200 shown in FIG. 3g. Specifically, a saw blade may be used to cut through the assembly shown in FIG. 3f into separate packages along the dambars 120.

Alternatively, the dambars 120 of the lead frame 100 may also be removed in the selectively etching step before the singulation step is conducted thereby significantly increasing the lifetime of the blade.

Note that the third portion 112c of each lead 112 of the lead frame 100 (see FIG. 3e) is selectively etched away thereby forming two rows of connection pads 113a and 113b (see FIG. 3f). In this way, the number of I/O connections is significantly increased while the pitch or spacing between adjacent leads is not required to be reduced. Accordingly, the finished packages 200 (see FIG. 3g) satisfy the need for a significantly higher number of connection pads in a smaller footprint.

The finished package can be mounted onto a substrate, such as a printed circuit board (PC board), like other leadless devices. For example, a PC board is screen printed with a solder paste in a pattern that corresponds to the pattern of the leads exposed from the bottom of the package. The package is then appropriately positioned on the PC board and the solder is reflowed by using the conventional surface mount technology. Alternatively, the leads exposed from the bottom of the package can be printed with solder paste and then mounted onto the PC board. Note that the second metal layer 180 (e.g., the tin/lead layer plated on the connection pads 113a, 113b and the die pads 114 exposed from the bottom of the package) facilitates solderability during the assembly process between the finished package and the substrate.

Figure 5:
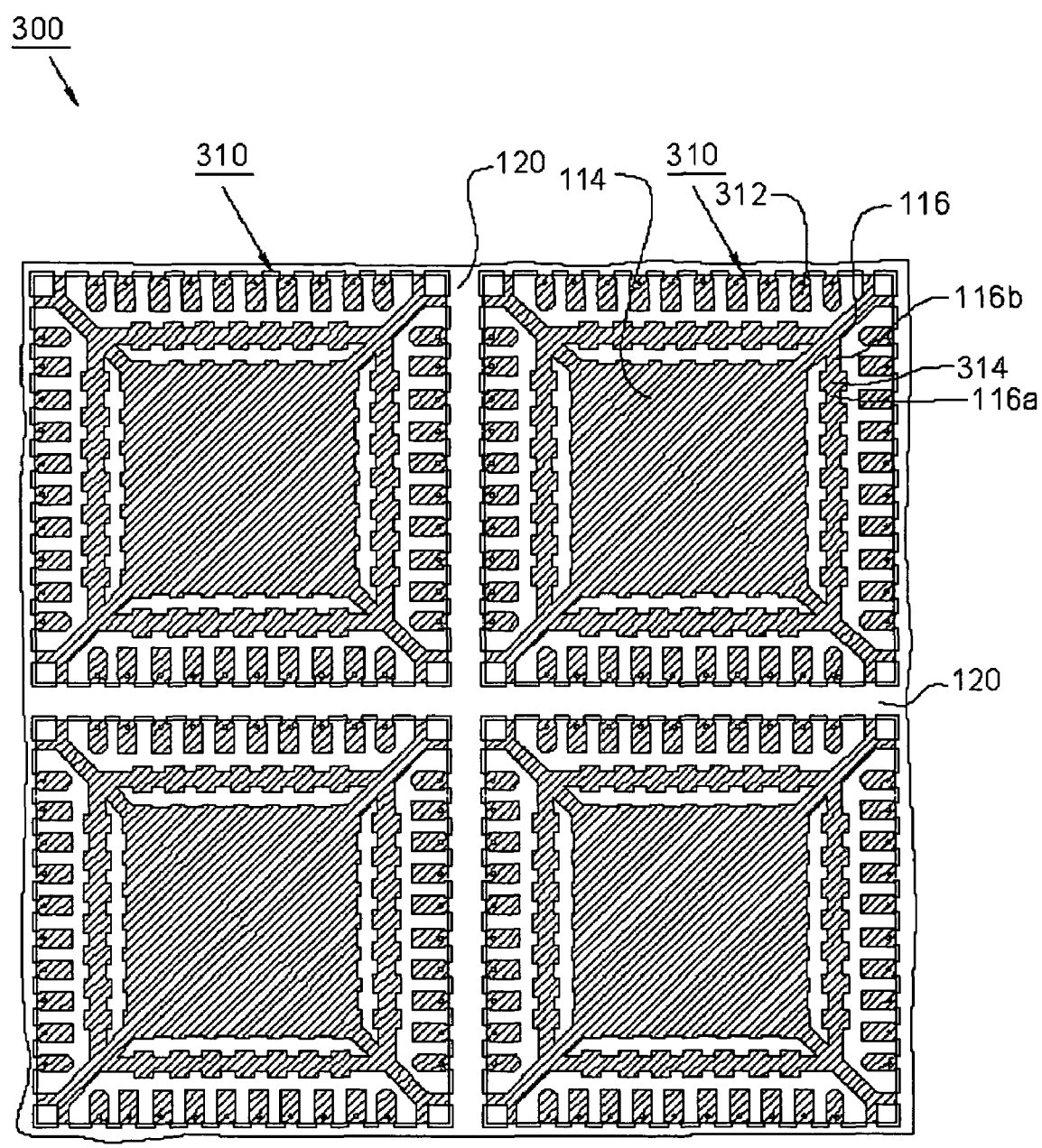
FIG. 5 is a top plan view of a lead frame for making a plurality of staggered dual-row leadless packages according to another embodiment of the present invention.

FIG. 5 illustrates a lead frame 300 for making a plurality of staggered dual-row leadless packages according to another embodiment of the present invention. The lead frame 300 includes a plurality of units 310 separated from each other by a plurality of dambars 120. The lead frame 300 is substantially identical to the lead frame 100 of FIG. 4 except that each unit 310 includes outer leads 312 and inner leads 314 instead of the leads 112, and the first metal layer 130 is not provided on the connecting portions 116a between the inner leads 116 and the connecting portions 116b between the inner leads 116 and the tie bars 116. Each of the outer leads 312 is connected to one of the dambars 120. Each of the inner leads 314 is disposed between the outer leads 312 and the die pad 114, and the inner leads 314 are connected to each other and to the tie bars 116. Note that the leads 312 and 314, the die pads 114 and the tie bars 116 are hatched in FIG. 5 to facilitate understanding. Preferably, the lead frame 300 is half-etched at its upper surface to form an indentation at the connecting portions 116a between the inner leads 116 and the connecting portions 116b between the inner leads 116 and the tie bars 116.

The present invention further provides a process for making a plurality of staggered dual-row leadless packages using the lead frame 300 of FIG. 5. This process is substantially identical to the aforementioned process, except that each of the leads 312 and 314 is electrically coupled to one bonding pad of one of the chips, and an etching step is conducted to selectively remove the connecting portions 116a between the inner leads 116 such that the inner leads 116 are electrically isolated from each other. Alternatively, the connecting portions 116b between the inner leads 116 and the tie bars 116 may also be removed in the etching step just described above. In addition, after the encapsulating step is conducted, the second metal layer 180 (e.g., a layer of tin/lead) is selectively plated on the leads 312, 314 and the die pads 114 exposed from the bottom of the molded product such that the second metal layer 180 is not provided on the connecting portions 116a between the inner leads 116 and the connecting portions 116b between the inner leads 116 and the tie bars 116.

Figure 6:
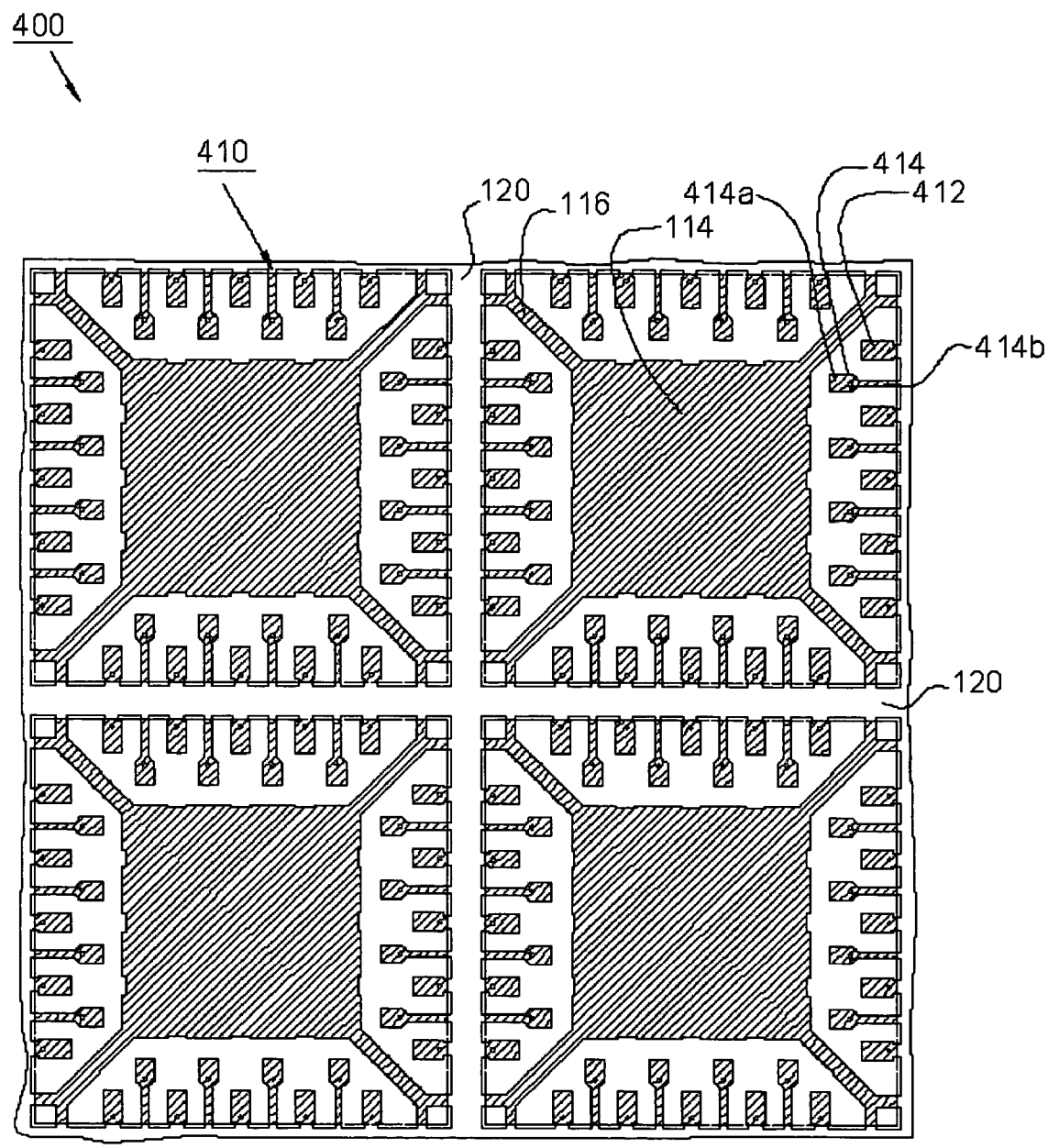
FIG. 6 is a top plan view of a lead frame for making a plurality of staggered dual-row leadless packages according to another embodiment of the present invention.

FIG. 6 illustrates a lead frame 400 for making a plurality of staggered dual-row leadless packages according to another embodiment of the present invention. The lead frame 400 includes a plurality of units 410 separated from each other by a plurality of dambars 120. The lead frame 400 is substantially identical to the lead frame 100 of FIG. 4 with an exception that each unit 410 includes first leads 412 and second leads 414 instead of the leads 112. Each of the first leads 412 has one end connected to the dambars 120. Each of the second leads 414 has an enlarged portion 414a adapted for electrically coupling to the semiconductor chip and a narrowed portion 414b connected to the dambars 120. Note that the leads 412 and 414, the die pads 114 and the tie bars 116 are hatched in FIG. 5 to facilitate understanding. Such kind of lead frame design is fully compatible with the existing materials and does not affect their properties; it is cheap and of extremely easy implementation. In addition, the packaging method using the lead frame 400 is fully compatible with the current processes and related equipment used in the industry.

Although the invention has been explained in relation to its preferred embodiment, it is to be understood that many other possible modifications and variations can be made without departing from the spirit and scope of the invention as hereinafter claimed. For example, although only dual-row structure is illustrated as preferred embodiments, the leadless packages with three rows of connection pads or above are still considered within the spirit and scope of the invention.

What is claimed is:

1. A process for making a plurality of leadless semiconductor packages, comprising the steps of:

providing a lead frame having opposing upper and lower surfaces, the lead frame including a plurality of units in an array arrangement, a plurality of dambars between the units, and a first metal layer formed on the upper surface of the lead frame, each unit of the lead frame including a die pad and a plurality of leads each having a first portion, a second portion and a third portion connecting the first portion and the second portion, wherein the first metal layer is not provided on the third portion;

attaching a plurality of chips onto the die pads of the lead frame, wherein each of the chips has a plurality of bonding pads on an active surface thereof;

electrically coupling each lead of the lead frame to two different bonding pads of one of the chips such that the first portion of each lead is electrically connected to one bonding pad and the second portion of each lead is electrically connected to the other bonding pad;

encapsulating the chips against the upper surface of the lead frame to form a molded product;

selectively plating a second metal layer on the first portions and the second portions of the leads and the die pads exposed from the bottom of the molded product wherein the second metal layer is not provided on the third portions of the leads;

selectively etching away the third portion of each lead of the lead frame such that the first portion and the second portion are electrically isolated from each other; and conducting a singulation step to obtain the leadless semiconductor packages.

2. The process as claimed in claim 1, further comprising the steps of attaching a tape onto the lower surface of the lead frame before the chips is encapsulated against the lead frame, and removing the tape from the bottom of the molded product.

3. The process as claimed in claim 1, wherein each of the leads of the lead frame is half-etched at its upper surface to form an indentation at the third portion thereof.

4. The process as claimed in claim 1, wherein the step of selectively etching away the third portion of each lead of the lead frame includes the steps of:

forming a photoresist pattern on the bottom of the molded product such that the entire lower surface of the lead frame is covered with photoresist pattern except the third portion of each lead of the lead frame; and etching the lower surface of the lead frame with the photoresist pattern as mask.

5. The process as claimed in claim 1, further comprising a step of selectively etching away the dambars of the lead frame.

6. The process as claimed in claim 5, wherein the step of selectively etching away the dambars of the lead frame and the step of selectively etching away the third portion of each lead of the lead frame are performed simultaneously and includes the steps of:
forming a photoresist pattern on the bottom of the molded product such that the entire lower surface of the lead frame is covered with the photoresist pattern except the dambars and the third portion of each lead; and
etching the lower surface of the lead frame with the photoresist pattern as mask.

7. The process as claimed in claim 1, wherein the step of selectively plating a second metal layer on the first portions and the second portions of the leads and the die pads includes the steps of:
forming a photoresist pattern on the bottom of the molded product such that the photoresist pattern covers the third portions of the leads exposed from the bottom of the molder product but does not cover the first portions and the second portions of the leads and the die pads; and
plating a second metal layer on the lower surface of the lead frame with the photoresist pattern as mask.

8. The process as claimed in claim 1, wherein the first metal layer comprises a layer of silver.

9. The process as claimed in claim 1, wherein the second metal layer comprises a layer of tin/lead.

10. A process for making a plurality of leadless semiconductor packages, comprising the steps of:
providing a lead frame having opposing upper and lower surfaces, the lead frame including a plurality of units in an array arrangement, a plurality of dambars between the units, and a first metal layer formed on the upper surface of the lead frame, each unit of the lead frame including a die pad, a plurality of tie bars for connecting the die pad to the dambars, a plurality of outer leads each connected to one of the dambars, and a plurality of inner leads disposed between the outer leads and the die pad, wherein the inner leads are connected to each other and the tie bars, and the first metal layer is not provided on the connecting portions between the inner leads;
attaching a plurality of chips onto the die pads of the lead frame;
electrically coupling the chips to the outer leads and the inner leads of the lead frame;
encapsulating the chips against the upper surface of the lead frame to form a molded product;
selectively plating a second metal layer on the inner leads, the outer leads and the die pads exposed from the bottom of the molded product wherein the second metal layer is not provided on the connecting portions between the inner leads of the lead frame;
selectively etching away the connecting portions between the inner leads of the lead frame such that the inner leads are electrically isolated from each other; and
conducting a singulation step to obtain the leadless semiconductor packages.

11. The process as claimed in claim 10, further comprising the steps of attaching a tape onto the lower surface of the lead frame before the chips is encapsulated against the lead frame, and removing the tape from the bottom of the molded product.

12. The process as claimed in claim 10, wherein the lead frame is half-etched at its upper surface to form an indentation at the connecting portions between the inner leads.

13. The process as claimed in claim 10, wherein the step of selectively etching away the connecting portions between the inner leads of the lead frame includes the steps of:
forming a photoresist pattern on the bottom of the molded product such that the entire lower surface of the lead frame is covered with photoresist pattern except the connecting portions between the inner leads of the lead frame; and
etching the lower surface of the lead frame with the photoresist pattern as mask.

14. The process as claimed in claim 10, wherein the first metal layer and the second metal layer are not provided on the connecting portions between the inner leads and the tie bars of the lead frame, and the method further comprises the steps of selectively etching away the connecting portions between the inner leads and the tie bars.

15. The process as claimed in claim 10, wherein the connecting portions between the inner leads of the lead frame as well as between the inner leads and the tie bars are selectively etched away by the steps of:
forming a photoresist pattern on the bottom of the molded product such that the entire lower surface of the lead frame is covered with photoresist pattern except the connecting portions between the inner leads of the lead frame as well as between the inner leads and the tie bars; and
etching the lower surface of the lead frame with the photoresist pattern as mask.

16. The process as claimed in claim 10, further comprising a step of selectively etching away the dambars of the lead frame.

17. The process as claimed in claim 16, wherein the step of selectively etching away the dambars of the lead frame and the step of selectively etching away the connecting portions between the leads of the lead frame are performed simultaneously and includes the steps of:
forming a photoresist pattern on the bottom of the molded product such that the entire lower surface of the lead frame is covered with the photoresist pattern except the dambars and the connecting portions between the leads; and
etching the lower surface of the lead frame with the photoresist pattern as mask.

18. The process as claimed in claim 10, wherein the step of selectively plating a second metal layer on the inner leads, the outer leads and the die pads includes the steps of:
forming a photoresist pattern on the bottom of the molded product such that the photoresist pattern covers the connecting portions between the inner leads exposed from the bottom of the molder product but does not cover the inner leads, the outer leads and the die pads; and
plating a second metal layer on the lower surface of the lead frame with the photoresist pattern as mask.

19. The process as claimed in claim 10, wherein the first metal layer comprises a layer of silver.

20. The process as claimed in claim 10, wherein the second metal layer comprises a layer of tin/lead.

* * * * *